(12) United States Patent
Liang et al.

(10) Patent No.: US 11,437,312 B2
(45) Date of Patent: Sep. 6, 2022

(54) HIGH PERFORMANCE METAL INSULATOR METAL CAPACITOR

(71) Applicant: International Business Machines Corporation, Armonk, NY (US)

(72) Inventors: Jim Shih-Chun Liang, Poughkeepsie, NY (US); Naftali E Lustig, Croton on Hudson, NY (US); Atsushi Ogino, Fishkill, NY (US); Nan Jing, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/785,454

(22) Filed: Feb. 7, 2020

(65) Prior Publication Data

US 2021/0249349 A1    Aug. 12, 2021

(51) Int. Cl.
| | | |
|---|---|---|
| *H01L 23/522* | (2006.01) | |
| *H01L 21/3105* | (2006.01) | |
| *H01L 49/02* | (2006.01) | |
| *H01L 23/528* | (2006.01) | |

(52) U.S. Cl.
CPC .... *H01L 23/5223* (2013.01); *H01L 21/31053* (2013.01); *H01L 23/5226* (2013.01); *H01L 28/40* (2013.01); *H01L 23/5286* (2013.01); *H01L 28/60* (2013.01)

(58) Field of Classification Search
CPC ........... H01L 21/76811; H01L 23/5329; H01L 23/5226; H01L 21/762; H01L 23/5223; H01L 28/40; H01L 21/31053; H01L 28/60; H01L 23/5286
See application file for complete search history.

(56) References Cited

U.S. PATENT DOCUMENTS

| | | | |
|---|---|---|---|
| 7,282,404 B2 | 10/2007 | Coolbaugh et al. | |
| 7,635,908 B2 | 12/2009 | Barth et al. | |
| 9,252,203 B2 | 2/2016 | Zang et al. | |
| 9,397,152 B2 | 7/2016 | Cheng et al. | |
| 9,806,032 B1 | 10/2017 | Lin et al. | |
| 2002/0151150 A1 | 10/2002 | Bernstein et al. | |
| 2002/0155676 A1* | 10/2002 | Stetter | H01L 28/60 438/396 |
| 2005/0274987 A1* | 12/2005 | Coolbaugh | H01L 23/5223 257/222 |
| 2006/0234443 A1 | 10/2006 | Yang et al. | |
| 2007/0111430 A1 | 5/2007 | Chudzik et al. | |
| 2007/0141800 A1* | 6/2007 | Kurihara | H01L 24/05 257/E23.079 |
| 2014/0145302 A1 | 5/2014 | Hong | |
| 2018/0286803 A1* | 10/2018 | Leobandung | H01L 28/40 |

* cited by examiner

*Primary Examiner* — Patricia D Valenzuela
(74) *Attorney, Agent, or Firm* — Jeffrey S LaBaw; L Jeffrey Kelly; Alvin Borromeo

(57) ABSTRACT

A metal insulator metal capacitor and method for fabricating a metal insulator metal capacitor (MIMcap) are disclosed. A first level metal pattern is embedded in a first dielectric layer over a substrate. The first level metal pattern has a top surface co-planar with a top surface of the first dielectric layer. In a selected etch step, either one of the first metal pattern or the first dielectric is etched to form a stepped top surface. A conformal insulating layer on the stepped top surface. The MIMcap is formed on the conformal insulating layer in a conformal manner.

17 Claims, 15 Drawing Sheets

HIGH PERFORMANCE METAL INSULATOR METAL CAPACITOR

BACKGROUND OF THE INVENTION

This disclosure relates to integrated circuit devices. More specifically, it relates to a method and structure to create metal insulator metal capacitors (MIMcaps) in semiconductor devices.

As the dimensions of modern integrated circuitry in semiconductor chips continue to shrink, conventional semiconductor manufacturing technologies are increasingly challenged to make smaller and smaller structures.

The high frequency and low power of semiconductor chips requires the use of decoupling capacitors for mitigating power supply or switching noise caused by changes in current flowing in an integrated chip. One popular choice at the so-called "back-end of line" (BEOL) for decoupling capacitors are MIMcaps for high capacitor density. As the need for MIMcaps at these levels is increasing as well as the portion of the chip design available for capacitors in the designs is shrinking, some of the existing MIMcap designs may not be available to the chip designer. Some MIMcap designs require additional lithography masks, additional levels of processing and relatively large areas of the chip.

Thus, it is desirable to provide processes and designs which can be used to make improved metal insulator metal capacitors (MIMcaps) with increased capacitance density.

BRIEF SUMMARY

According to this disclosure, a metal insulator metal capacitor and method for fabricating a metal insulator metal capacitor (MIMcap) are disclosed. A first level metal pattern is embedded in a first dielectric layer over a substrate. The first level metal pattern has a top surface co-planar with a top surface of the first dielectric layer. In a selected etch step, either one of the first metal pattern or the first dielectric is etched to form a stepped top surface. A conformal insulating layer on the stepped top surface. The MIMcap is formed on the conformal insulating layer in a conformal manner.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
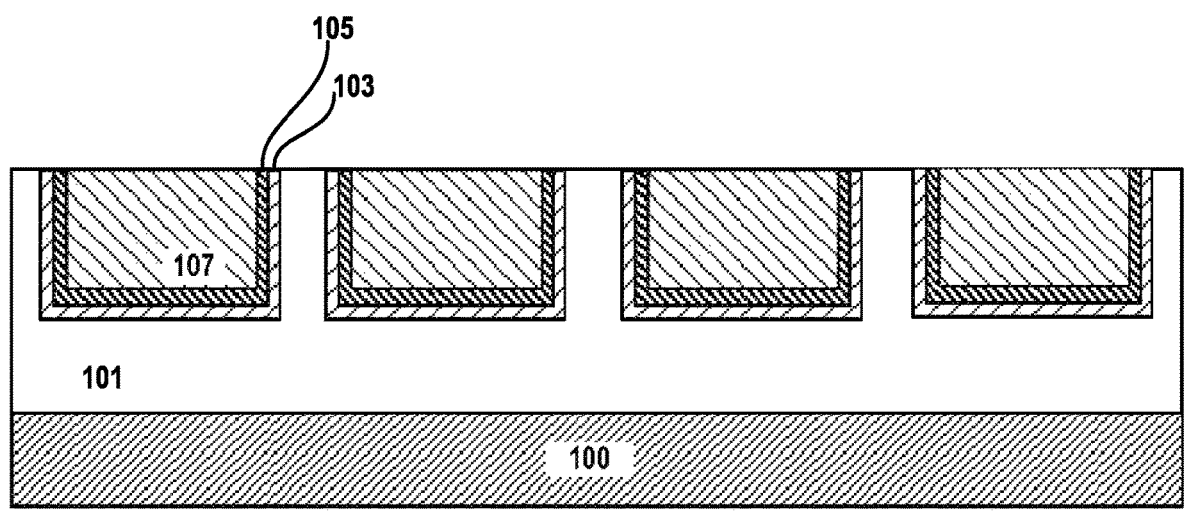
FIG. 1 is a cross-sectional diagram of a starting structure of a metal insulator metal capacitors (MIMcap) fabricated according to an embodiment of the invention.

At a high level, the invention builds metal insulator metal (MIM) capacitor plates between two layers of metal lines in the semiconductor chip. In a first embodiment, the metal lines in a lower level are etched, creating a stepped topology with metal lands below a set of interstitial dielectric lands on which the metal insulator metal capacitor (MIMcap) is built. In a second embodiment, the dielectric is etched, creating a stepped topology with metal lands above the set of interstitial dielectric lands on which the metal insulator metal capacitor (MIMcap) is built. The stepped topology increases the effective area of the capacitor plates since both horizontal and vertical surfaces are used for the capacitor plates. Thus, the recesses creating the stepped topology used by the invention increase the capacitance density possible for a given capacitor area. The placement of a MIMcap between the two layers of metal lines using the stepped topology is believed unique. Further, the use of additional lithography masks is limited by embodiments of the invention. Embodiments of the invention take advantage of the natural alignment of features in the metallurgy to avoid an additional lithography mask.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam or deposited by PECVD, CVD, PVD, ALD and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of $SiO_2$ and $Si_3N_4$, and metal oxides like tantalum oxide that have relative dielectric constants above that of $SiO_2$ (above 3.9). The dielectric can be a combination of two or more of these materials. The thickness of dielectrics herein may vary contingent upon the required MIMcap device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For the sake of brevity, conventional techniques related to semiconductor device and integrated circuit (IC) fabrication may or may not be described in detail herein. Moreover, the various process steps described herein can be incorporated into a more comprehensive process including additional steps or functionality not described herein. In particular, there are steps in semiconductor device manufacturing which are well known and so, in the interest of brevity, many conventional steps will only be mentioned briefly herein or will be omitted entirely without providing the well-known process details.

Embodiments will be explained below with reference to the accompanying drawings.

FIG. 1 is a cross-sectional diagram of a starting structure of a MIMcap fabricated according to an embodiment of the invention. In the drawing, a substrate 100, e.g., a semiconductor substrate, is provided. The substrate 100 will comprise a semiconductor wafer in which a plurality of devices (e.g., transistors, capacitors, resistors) is fabricated in a typical embodiment. The devices are interconnected by multiple wiring layers. In one such layer, over the substrate 100, a dielectric layer 101 is deposited. The dielectric layer 101 is depicted as a single layer, though one skilled in the art would understand that in embodiments of the invention, several layers of dielectric could be used, possibly of different dielectrics. A $SiO_2$ based dielectric, a low-k dielectric or an ultra-low-k dielectric is used as the dielectric material in embodiments of the invention. In preferred embodiments, dielectric layer in an inter-level dielectric (ILD), such as an inorganic dielectric or organic dielectric. The ILD is deposited by a deposition process, including, but not limited to CVD, PVD, plasma enhanced CVD, atomic layer deposition (ALD), evaporation, chemical solution deposition, or like processes. Non-limiting examples of ILD materials include $SiO_2$, silsesquioxanes, carbon-doped oxides (i.e., organosilicates) that include atoms of Si, C, O and H, thermosetting polyarylene ethers, or multilayers thereof. The ILD can be a low-k or ultra-low-k dielectric material with a dielectric constant that is about 4.0 or less, or a dielectric constant of about 2.8 or less.

In the dielectric layer 101, a set of parallel metal lines are fabricated. In one known process, a pattern of a set of trenches is defined in a lithographic patterning process followed by an etch process. The trench is filled with successive layers of liner/barrier layers 103, 105 and a bulk conductor layer 107. One function of the liner/barrier layers 103, 105 is to prevent diffusion of the bulk conductor 107 into the dielectric 103; they are optional in embodiments in which the bulk conductor 107 does not diffuse into the dielectric 101. Typically, the bulk conductor layer 107 is comprised of one or more conductive material, e.g., metals such as Cu or Al or their alloys, although other conductive materials such as other metals and metal alloys can be used. Suitable barrier/liner materials include Ta, Ti, W, Co and Ru, and their nitrides, TaN, TiN, WN, CoN and RuN.

The deposition is followed by a planarization process such as a chemical mechanical polishing (CMP) process to provide a planar top surface which is comprised of top surfaces of the dielectric layer 101, liner/barrier layers 103, 105 and bulk conductor layer 107. CMP processes are well known to the art. Conventional deposition processes such as atomic layer deposition (ALD), chemical vapor deposition (CVD), plasma enhanced chemical vapor deposition (PECVD), electroplating are used to deposit the conductor layers in respective embodiments.

In some embodiments of the invention, the starting metallurgy (the liner/barrier layers 103, 105 and a bulk conductor layer 107) is thicker than standard metal lines. In one embodiment of the invention, the desired thickness of the bulk conductor layer 107 ranges between 3-6 um in thickness and the liner/barrier layers 103, 105 range between 25-100 nm in the liner/barrier layers in thickness. In embodiments, the liner/barrier layers 103, 105 are comprised of TaN and/or Ta and the bulk conductor layer 107 is copper or a copper alloy. For ease in illustration, the substrate 100 is omitted from the remainder of the drawings.

Although four trenches are shown, any number of via trenches can be formed, according to the design of the MIMcap given the design constraints of the chip design. In preferred embodiments, the metal wires comprised of layers 103, 105 are 107 are functional wires which interconnect devices in the underlying substrate. Some of the wires may be used to connect the MIMcap to other devices in the chip. In other embodiments, at least one of the wires can be a "dummy" or nonfunctional feature which is placed in the layer to add more topology for the MIMcap.

Figure 2:
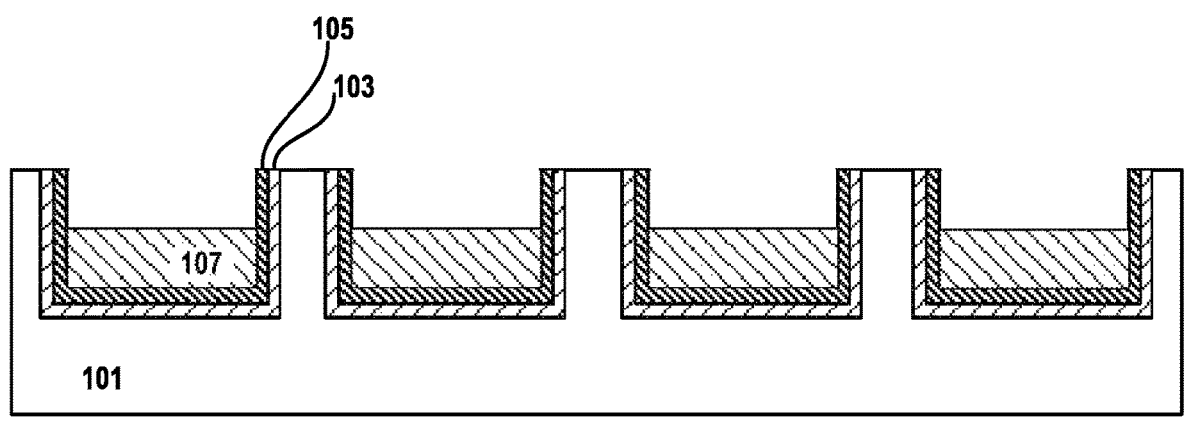
FIG. 2 is a cross-sectional diagram of a structure of a MIMcap after an etch step according to an embodiment of the invention.

FIG. 2 is a cross-sectional diagram of a structure of a MIMcap after an etch step is performed according to an embodiment of the invention. In this step, the etch process recesses the conductor layer 107, e.g., Cu, using known wet chemistries such as SC1, HF/H2O2 which selectively etches main conductor layer 107, but not the liner/barrier layers 103, 105 or the dielectric layer. This creates a stepped topography which increases the total area of the MIMcap. In this step, the Cu is etched down to a desired height for the first metal line conductor. For example, in preferred embodiments, the final height of the metal conductor 107 is on the order of 3-4 um tall. In alternative embodiments, both the liner/barrier layers 103, 105 and the conductor layer 107 are recessed.

A design constraint is the desired capacitance of the resulting MIMcap; the amount of bulk conductor 107 etched will create vertical surfaces which support parts of the overall area of the capacitor plates and add to the capacitance density of the MIMcap. In addition to the vertical parts of the capacitor plates, the total capacitance will also depend on the horizontal portions which cover the dielectric lands between lines and the tops of the metal lines (the width of the lines). The cumulative vertical and horizontal dimensions add up to one dimension of the capacitor plate area. As the drawings are cross-sections, one skilled in the art will appreciate that the features will have a certain depth (i.e. into the page) as well which is the other dimension of the area of the capacitor plates. Because embodiments of the present invention are three-dimensional (3D) MIMcap structures, they provide a greater capacitance than would a planar capacitor over the same chip area.

Figure 3:
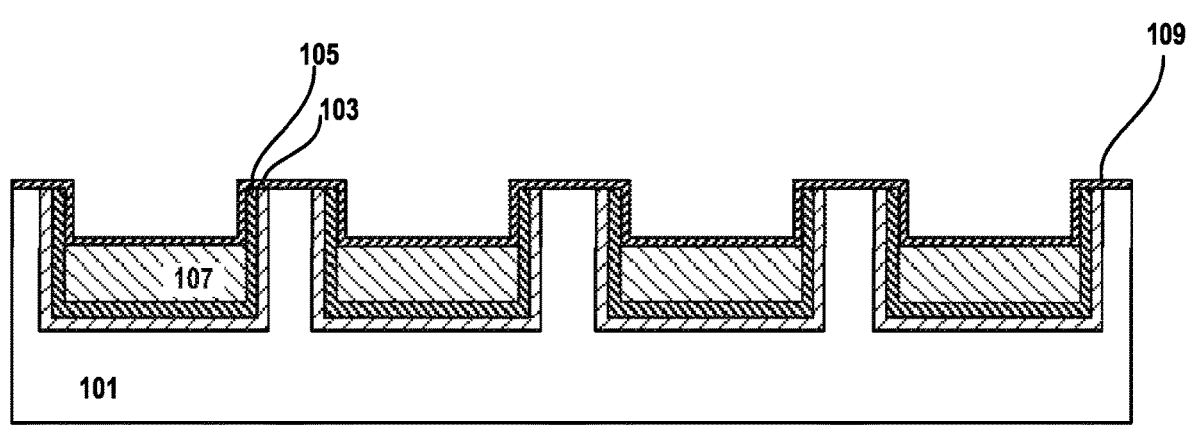
FIG. 3 is a cross-sectional diagram of a structure of a MIMcap after a cap layer deposition step according to an embodiment of the invention.

FIG. 3 is a cross-sectional diagram of a structure of a MIMcap after a cap layer deposition step according to an embodiment of the invention. In this step, the cap layer 109 functions as first dielectric layer which will separate the first metal line layer from the MIMcap and provide passivation of the copper. In preferred embodiments, the cap layer 109 is comprised of silicon carbon-nitride (SiCN). The SiCN, layer can be deposited by CVD or ALD at a desired thickness ranging between 100-500 nm. In alternative embodiment, materials such as SiN and SiC are used as the cap layer. The cap layer should have the properties of good electrical insulator with good adhesion to the bulk conductor (e.g., to Cu) to prevent delamination and electromigration. A high-k dielectric is desired to improve time-dependent dielectric breakdown (TDDB) properties.

Figure 4:
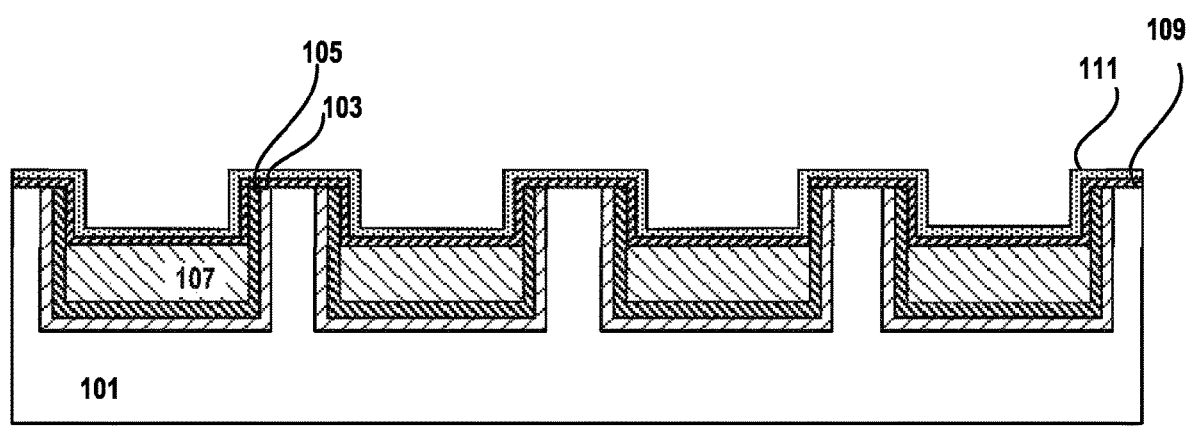
FIG. 4 is a cross-sectional diagram of a structure of a MIMcap after an insulator layer deposition according to an embodiment of the invention.

FIG. 4 is a cross-sectional diagram of a structure of a MIMcap after an insulator layer deposition according to an embodiment of the invention. In this step, the second dielectric layer 111 is deposited which together with the first dielectric layer 109 will separate the first metal line layer, e.g., Cu, from the MIMcap. In preferred embodiments, the second dielectric layer 111 is comprised of PECVD tetraethyl orthosilicate (TEOS). While in embodiments of the invention either the first or second dielectric is absent, in preferred embodiments, the dielectric between the first metal lines and the MIMcap is a dual layer dielectric.

A CVD process is used to deposit TEOS in a preferred embodiment at a thickness which ranges between 0.5 um-2 um. In alternative embodiments, materials such as USG (undoped silicate glass), low-k OMCTS or SiCOH, LTO (low temperature oxide), FTEOS (fluorinated TEOS), ULK (ultra-low k) porous SiCOH are used. The dielectric layer 111 should have the properties of a good electrical insulator, as low-k dielectric as possible that is still mechanically strong to cracking and/or delamination; SiCN is the capping layer typically used to cap copper wiring to improve the adhesion to copper to prevent delamination and copper electromigration. It is typically a higher-k dielectric than an oxide layer. Since it is one goal of the invention to have low wiring capacitance to lower RC delays, the second dielectric layer 111 is typically an oxide which has lower k than the capping material.

Figure 5:
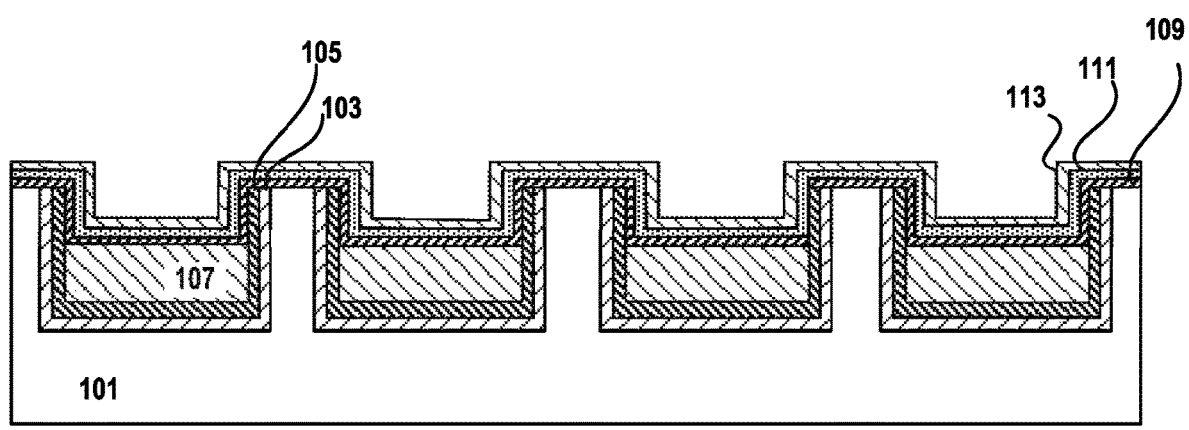
FIG. 5 is a cross-sectional diagram of a structure of a MIMcap after a bottom capacitor plate deposition according to an embodiment of the invention.

FIG. 5 is a cross-sectional diagram of a structure of a MIMcap after a bottom plate deposition according to an embodiment of the invention. In this step, the deposition of the bottom capacitor plate 113 is performed. In preferred embodiments, titanium nitride (TiN) is used as the bottom capacitor plate 113. However, in other embodiments, other conductive materials such as metals and metal alloys can be used as capacitor plate materials. In preferred embodiments, a CVD or ALD is used to deposit the bottom capacitor plate 113, for example TiN, to a desired thickness. Embodiments have thicknesses which range between 25-200 nm. Alternative materials used in other embodiments include layers of at least one of Ti, W, Cu, Ta, TaN, A and Co. For a capacitor plate, the desired properties include low resistance conductors which can be deposited conformally; this causes low MIMcap leakage.

Figure 6:
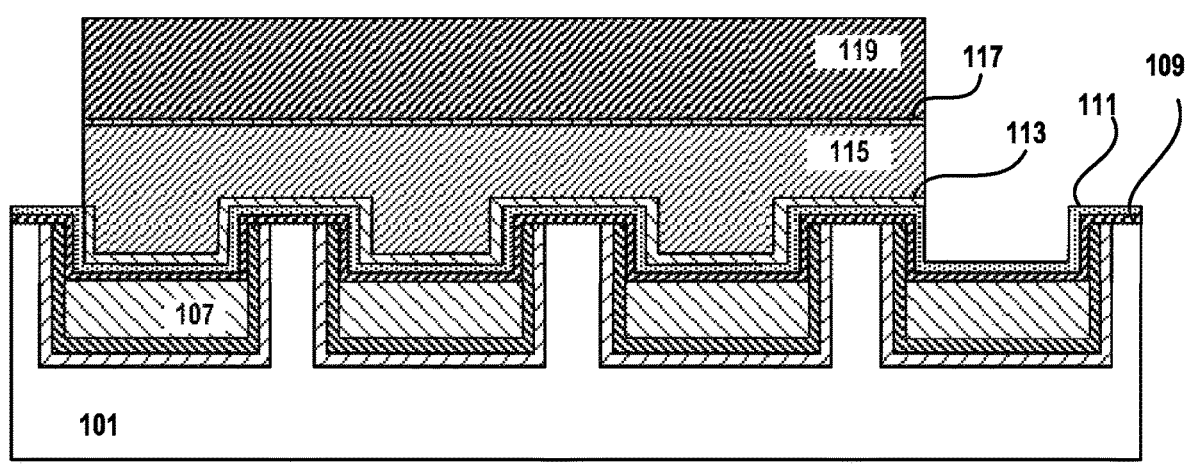
FIG. 6 is a cross-sectional diagram of a structure of a MIMcap after a patterning step according to an embodiment of the invention.

FIG. 6 is a cross-sectional diagram of a structure of a MIMcap after a patterning step according to an embodiment of the invention. In the drawing, a known tri-layer masking arrangement including an optical planarization layer (OPL) 115, a selective silicon anti-reflective coating (SiARC) 117 and a photoresist layer 119 (cumulatively OPL/SiARC/Resist) is used, however, other embodiments use other masking layers. After the photoresist 119 is developed, the pattern is used to etch the underlying SiARC and OPL layers 117, 115 and more importantly to etch the bottom capacitor plate 113 in areas not covered by the mask according to the capacitor design in a series of etch processes. One can use CF4 or any fluorinate carbon chemistries ($C_4F_8$, $CHF_3$, $CH_2F_2$ to etch the SiARC. Etchants including $O_2$, CO, $N_2/H_2$ mix (forming gas) are used in embodiments to etch the OPL; one can use a chlorinated chemistry such as $Cl_2$ to etch the TiN.

Figure 7:
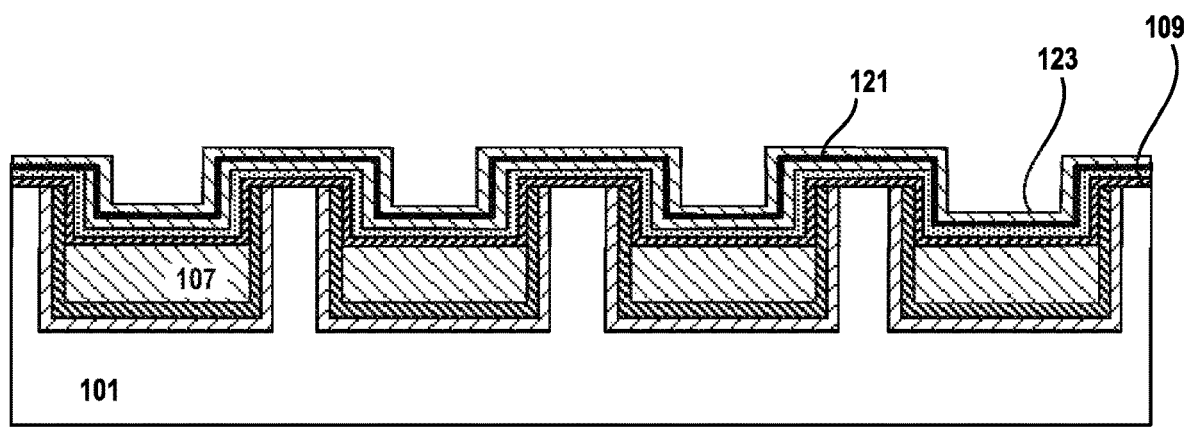
FIG. 7 is a cross-sectional diagram of a structure of a MIMcap after a dielectric and middle plate deposition according to an embodiment of the invention.

FIG. 7 is a cross-sectional diagram of a structure of a MIMcap after a dielectric layer and middle plate layer deposition according to an embodiment of the invention. In embodiments, a high-k dielectric layer 121 is used as the insulator layer and the middle capacitor plate layer 123 is a conductive material. Although some embodiments use only an upper and a lower capacitor plate, the addition of a middle capacitor plate 123 increases the capacitance density and total capacitance of a MIMcap fabricated according to the principles of the invention. Suitable high-k dielectrics include one or more high-k dielectrics such as $HfO_2$, $Al_2O_3$ and $Ta_2O_5$. Other high-k dielectrics include $ZrO_2$, $La_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2OxN_y$, SiON and $SiN_x$. Other dielectrics are known to the art and are used in other embodiments of the invention. The dielectric layers between the plates may have a thickness from 1 nm to 10 nm, although other thicknesses are contemplated and can be used in embodiments of the invention. Conductors and process such as those used for the bottom capacitor plate 113, e.g., TiN, are also used in a preferred embodiment for the middle capacitor plate layer 123.

Figure 8:
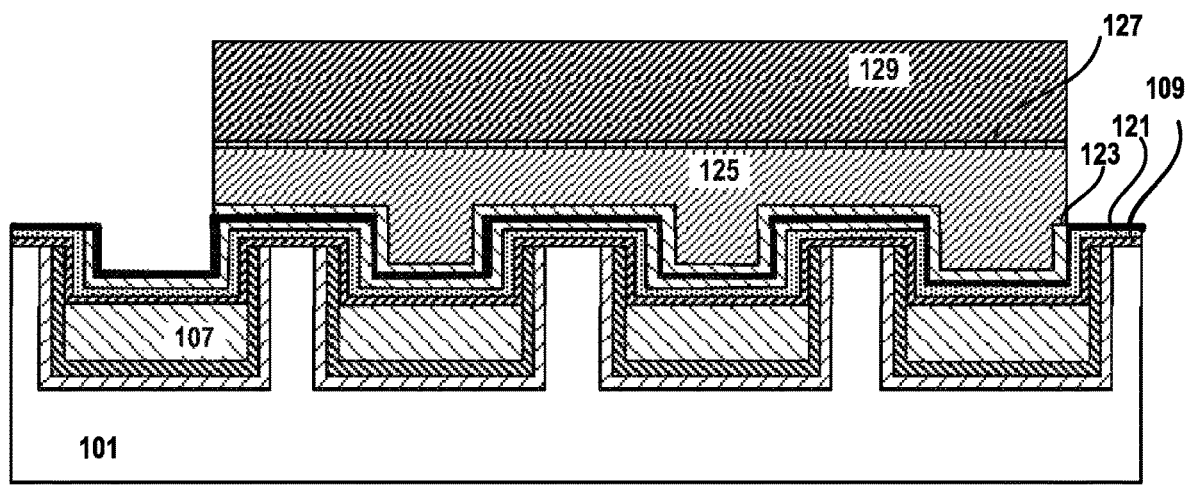
FIG. 8 is a cross-sectional diagram of a structure of a MIMcap after a patterning step according to an embodiment of the invention.

FIG. 8 is a cross-sectional diagram of a structure of a MIMcap after a patterning step according to an embodiment of the invention. As in the FIG. 6 drawing, a tri-layer OPL/SiARC/Resist arrangement 125, 127, 129 is used to pattern the middle capacitor plate 123 according to the MIMcap design in embodiments of the invention.

Figure 9:
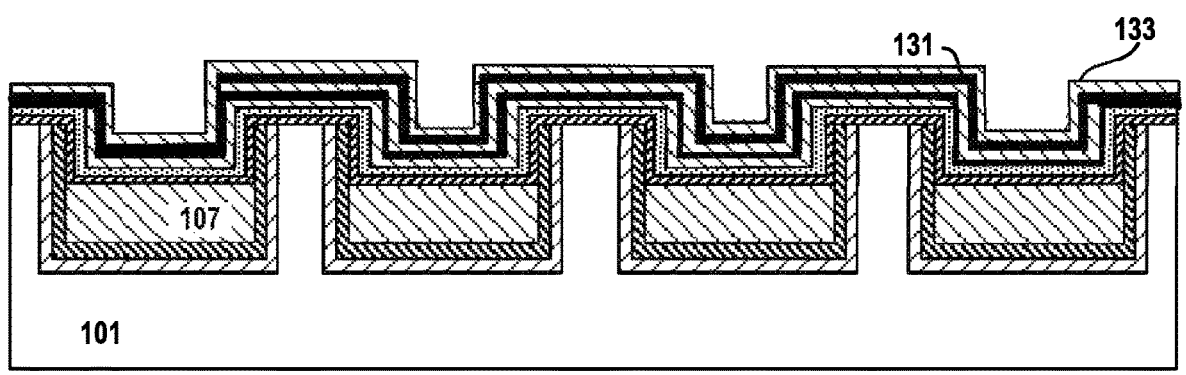
FIG. 9 is a cross-sectional diagram of a structure of a MIMcap after a dielectric and top plate deposition according to an embodiment of the invention.

FIG. 9 is a cross-sectional diagram of a structure of a MIMcap after a dielectric and top plate deposition according to an embodiment of the invention. This drawing represents the structure after a high-k dielectric layer 131 and the top capacitor plate layer 133 are deposited. Suitable high-k dielectrics include the same materials listed above for the first high-k layer 121. Conductors such as those used for the bottom capacitor plate 113 and middle capacitor plate 123 as listed above are also suitable for embodiments of the top capacitor plate 133.

Figure 10:
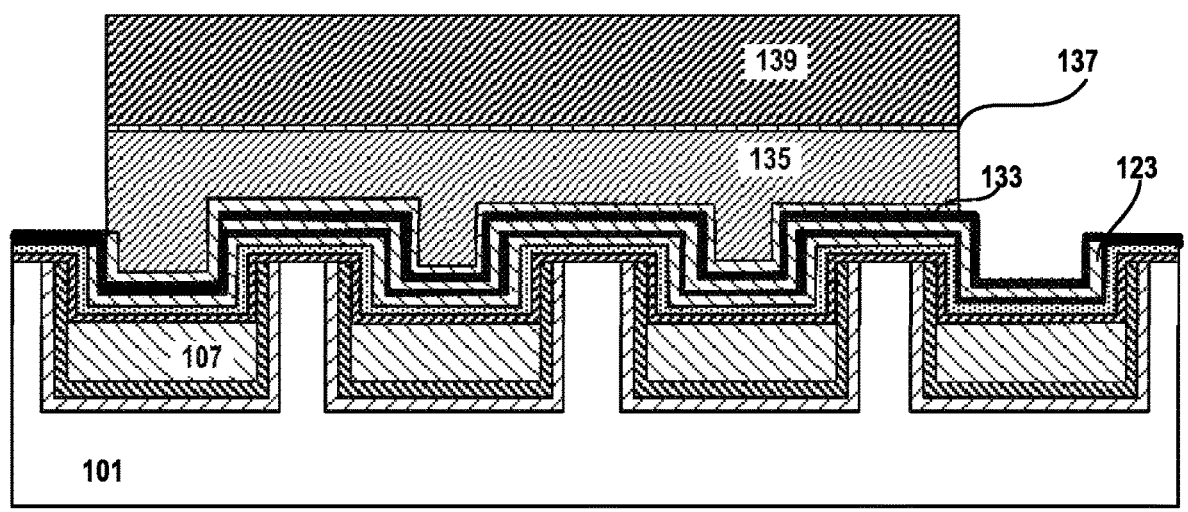
FIG. 10 is a cross-sectional diagram of a structure of a MIMcap after a patterning step according to an embodiment of the invention.

FIG. 10 is a cross-sectional diagram of a structure of a MIMcap after a patterning step according to an embodiment of the invention. As in the FIGS. 6 and 8, a tri-layer OPL/SiARC/Resist arrangement 135, 137, 139 is used to pattern the middle capacitor plate 133 in embodiments of the invention.

Figure 11:
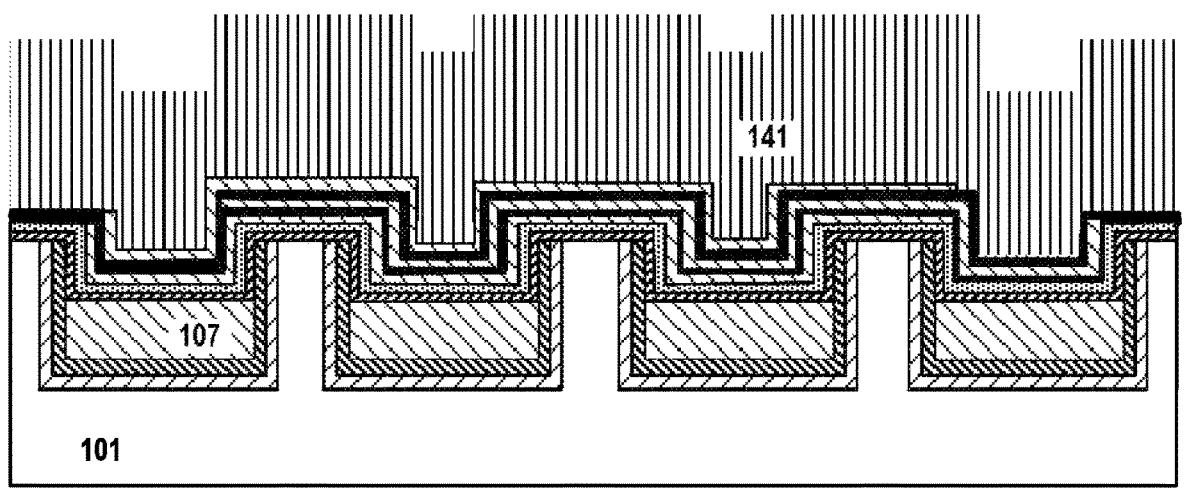
FIG. 11 is a cross-sectional diagram of a structure of a MIMcap after an interlayer dielectric deposition step according to an embodiment of the invention.

FIG. 11 is a cross-sectional diagram of a structure of a MIMcap after an isolation layer deposition (ILD) step according to an embodiment of the invention. In embodiments of the invention, an oxide layer 141 is deposited over the structure. The oxide layer 141 should be at least as thick as the recess etched in the bulk conductor layer 107 to planarize the device. In preferred embodiments, the oxide layer 141 ranges from 2 um to 6 um preferably in the range of 3 um to 5 um. A CVD process is used to deposit oxide in a preferred embodiment. Thicknesses range between 2 um to 6 um in embodiments of the invention. Alternative materials for the ILD layer 141 include USG (undoped silicate glass), low-k OMCTS or SiCOH, LTO (low temperature oxide), FTEOS (fluorinated TEOS), ULK (ultra-low k) porous SiCOH. The ILD layer 141 should be a good electrical insulator, preferably as a low k dielectric as possible which is still mechanically strong enough to resist cracking and/or delamination.

Figure 12:
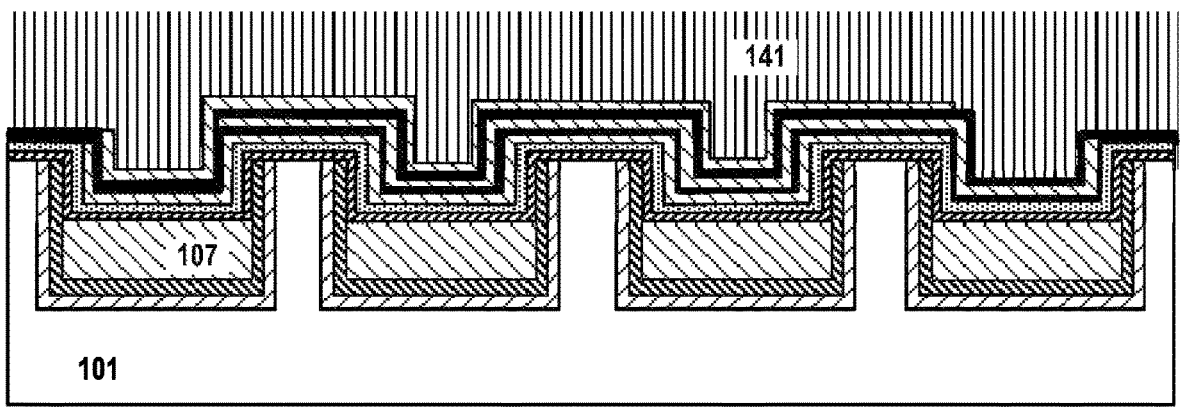
FIG. 12 is a cross-sectional diagram of a structure of a MIMcap after a planarization step according to an embodiment of the invention.

FIG. 12 is a cross-sectional diagram of a structure of a MIMcap after a planarization step according to an embodiment of the invention. The drawing depicts the structure after a top surface of the oxide layer 141 has been planarized, e.g., with a chemical mechanical polishing (CMP) process.

Figure 13:
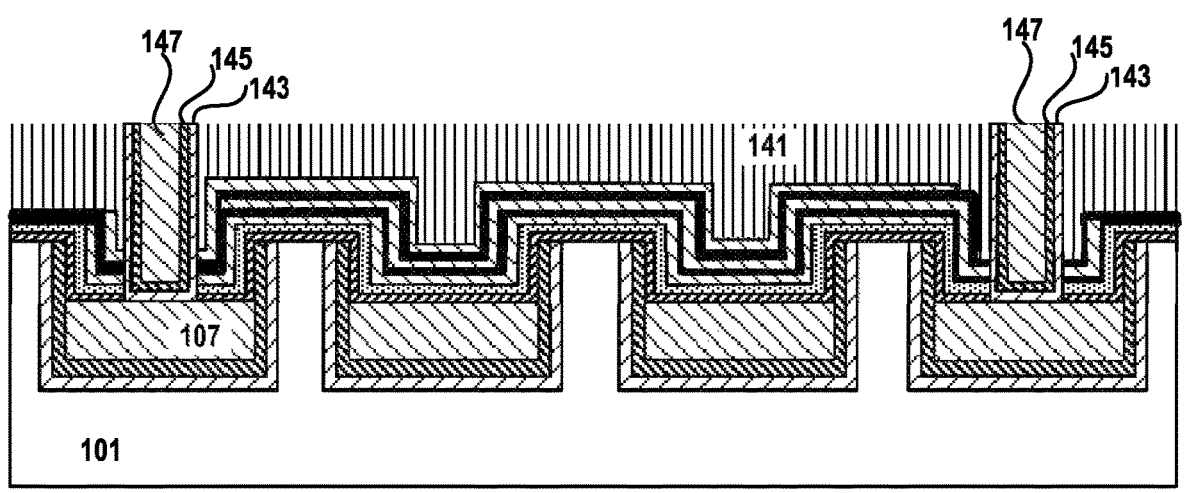
FIG. 13 is a cross-sectional diagram of a structure of a MIMcap after a contact forming step according to an embodiment of the invention.

FIG. 13 is a cross-sectional diagram of a structure of a MIMcap after a contact forming step according to an embodiment of the invention. In this drawing, the contacts have been fabricated in the oxide layer 141. In the illustrated embodiment, the contacts are formed from layers of liner/barrier layers 143, 145 and main conductor layer 147 like the first metal layer. Preferred embodiments use similar processes and materials as that described above to form liner/barrier layers 103, 105 and the bulk conductor layer 107 (shown in in FIG. 1). Notice that the left contact is the contact for the top and bottom capacitor plates while the right contact is the contact for the middle capacitor plate. In the drawing, the leftmost and rightmost conductor lines can serve as the lines for the MIMcap. Both contacts connect to the capacitor plates at the sidewall of the contact via structures.

An advantage of a sidewall connection is that less precision is required to locate the contact so that it lands right on a capacitor plate contact. If the contacts have to land on the plates, but instead, over-etches and punches through the plate, a short to a conductor below may occur; conversely, if the process underetches, the contact will not touch the plates. In addition, using the sidewall contact allows for contacting multiple plates (in this embodiment, the top and bottom plates) with the same contact. With side contact, it is also easier to make the contacts with just one lithography level. Note that in other embodiments of the invention for greater capacitance density, the number of capacitor plates can be greater than three. Another reason to use the side contact for a MIMcap is to not lose area for routing of metal lines at these levels.

To accommodate the MIMcap, the oxide layer 141 and the contact layers 143, 145, 147 can be a typical thickness for a via layer. In embodiments in which these layers are thicker, greater numbers of capacitor plates can be accommodated and the etch and deposition steps are adjusted accordingly.

Figure 14:
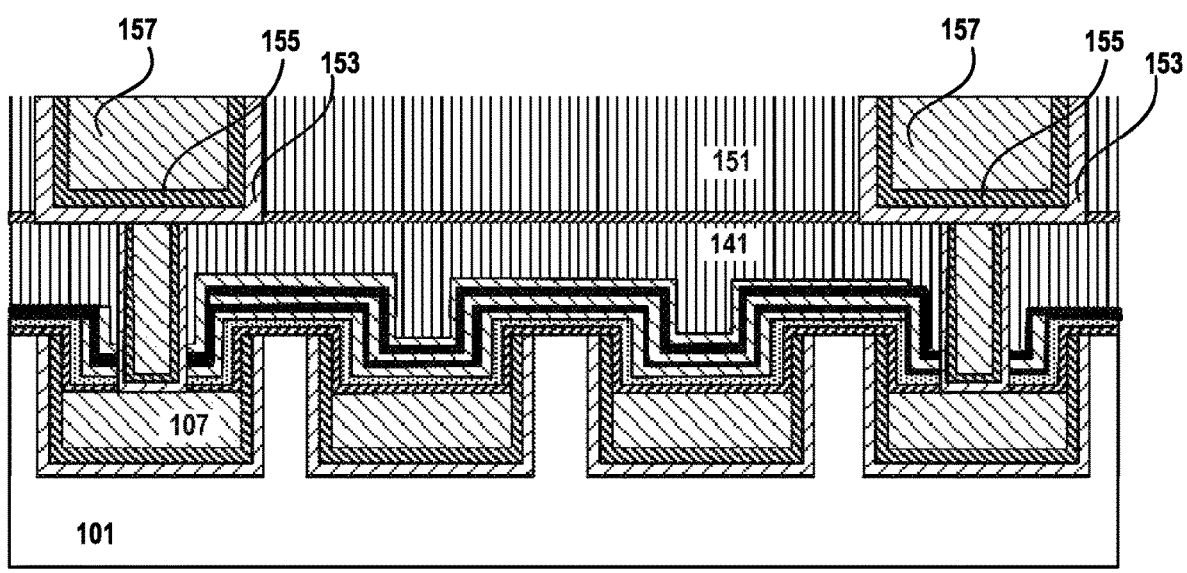
FIG. 14 is a cross-sectional diagram of a structure of a MIMcap after a top metal wire formation step according to an embodiment of the invention.

FIG. 14 is a cross-sectional diagram of a structure of a MIMcap after a top metal wire formation step according to an embodiment of the invention. A capping layer 149 of SiCN or other suitable capping layer material is deposited. Next, an ILD layer 151 is deposited and if needed planarized. Left and right contacts are formed from layers of liner/barrier layers 153, 155 and main conductor layer 157 like the first metal layer. Preferred embodiments use similar processes and materials as that described above to form the first metal wire level and the contact level. The drawing shows that the second level of metal wire could also be used to power the MIMcap. In yet other embodiments, only the lower layer of wiring, only the upper layer of wiring or a combination of a lower layer powering one set of plates and an upper wire powering the other set of plates. Additionally, in other embodiments of the invention, one or both of the contacts can terminate on a land of the lower dielectric 101 if the respective set of capacitor plates is being powered by an upper wire.

As shown in the drawing, the MIMcap is fabricated between the first metal layer and the second metal layer. In this embodiment, the first level metal, contact/via and second level metal are formed of similar materials and by similar processes. One skilled in the art will appreciate that either the materials in the layers or the processes used to form the layers can vary from one another while still falling within the spirit and scope of the invention.

In some chip designs, the thickness of the dual dielectric layers 109, 111 between the bottom capacitor plate 113 and the top of the first metal lines 103, 105 and 107 ranges between 0.6 um to 2.5 um.

To prevent capacitive coupling with the second level lines, the thickness of the ILD 141 layer can be increased above the process of record. For example, if the process of record thickness is 1 um, a 2 um layer will reduce the MIMcap to second metal capacitive coupling. In addition, larger dual dielectric 109, 111 thickness and ILD 141 thickness will reduce the metal line interlevel capacitance. In embodiments, the additional of more dielectric layers can also reduce interlevel capacitance effects.

In one embodiment, the expected capacitance density increases proportionally to the depth that the first metal line is etched. Define recess depth to be L and the pitch as the horizontal space occupied by the line and the space between the lines. The expected % capacitance increase is 2 L/Pitch*100%. In a typical product, the line density is 50%, that is the width of the line equals the line spacing. In such an embodiment, the % capacitance increase=L/W*100%. For lines having a width of 1.2 um. and a range of L between 1 um and 3 um, the invention increases capacitance from 83% to 250% over a planar capacitor which takes up the same chip area. If the planar MIMcap has a capacitance of 40 fF/um$^2$, a capacitor built with the invention would improve capacitance by 32 to 100 fF/um$^2$, i.e. for a total capacitance between 72 and 140 fF/um$^2$ without degrading leakage.

Figure 15:
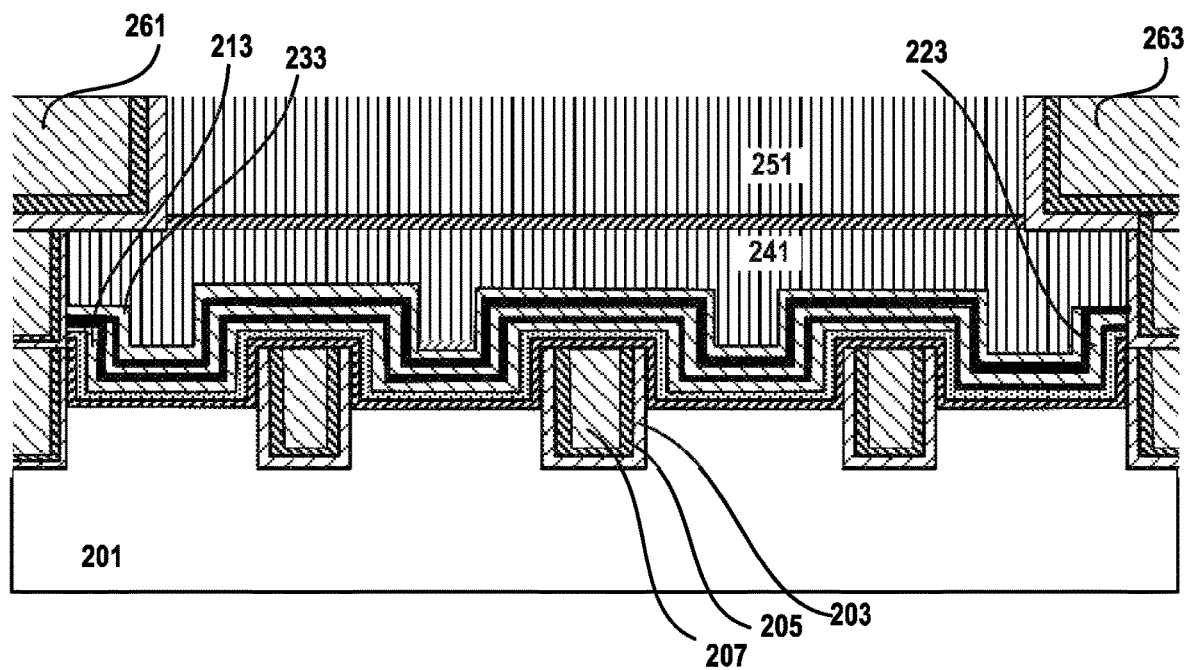
FIG. 15 is a cross-sectional diagram of a structure of a MIMcap according to another embodiment of the invention.

FIG. 15 is a cross-sectional diagram of a structure of a MIMcap according to another embodiment of the invention.

In this embodiment, the starting structure is similar to that in FIG. 1 (the drawings are not necessarily to scale). However, as compared to the structure in FIG. 2, the dielectric 201 between the metal wires (comprised of layers 203, 205, 207) is etched rather than the bulk conductor layer 207. The end result of that etch step is similar in that a stepped topology is created. As explained above, the stepped topology increases the area of the capacitor plates which provides for increased capacitance of the MIMcap and increased capacitance density. The process continues similar to that shown in FIGS. 3-14 and discussed above.

In the structure depicted in FIG. 15, like in the first embodiment above, the MIMcap is fabricated between the first metal layer and the second metal layer. Contact stack 261 is electrically coupled to the bottom capacitor plate 213 and top capacitor plate 233 of the MIMcap at the sidewall of the via. Contact stack 263 is electrically coupled to the middle capacitor plate 223 of the MIMcap at the sidewall of the via.

Those skilled in the art will appreciate that although the words the first metal layer and the second metal layer have used above to describe that MIMcap is fabricated between two metal layers, the first metal layer and the second metal layer are not necessarily the closest metal line layers to the device layer in the substrate. That is, the MIMcap can be fabricated between any two suitable metal line layers in embodiments of the invention.

The two embodiments provide somewhat different ways of achieving the same goal. Recessing the dielectric can be advantageous in that there is no copper etch which might cause defects on the copper surface or at the interface between the copper and the liner, both of which can be a reliability concern. However, by recessing the dielectric, because of the sidewall angle of the metal lines in certain structure, it might be harder to completely fill the space between the metal lines with dielectric layers and the MIMcap stack. This could lead to voids between the metal lines or loss of capacitor surface area. Recessing copper has advantages because the chemistry to recess copper is well-known, and reliability is easier to pass at levels of interconnections having relatively thick metal wires. The choice of which embodiment to use for a given chip design will depend on the chip design as well as the control that the fabrication facility has over respective processes.

Embodiments of the invention provide a low cost method to increase MIMcap capacitance density without degrading dielectric breakdown and leakage performances. By recessing the first level metal or the first dielectric which separates the first level lines, a MIMcap built according to the principles of the invention significantly increases the MIMcap plate surface area. The invention provides a low cost method as no additional lithography steps are required. As compared to some prior art processes for MIMcaps, the number of lithography steps is reduced by one because the recessed wiring forms natural alignment marks for electrode patterning; thus, there is no need to have a separate lithography step to make the alignment marks.

The resulting structures can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A metal insulator metal capacitor (MIMcap) comprising:
    a first level metal line pattern embedded in a first dielectric layer over a substrate, wherein top surfaces of a set of top surfaces of the first level metal line pattern are higher than a set of top surfaces of the first dielectric layer so that in combination the top surfaces form a stepped top surface and wherein the first level metal line pattern is embedded in the first dielectric layer so that a set of bottom surfaces of the first level metal line pattern are lower than the top surfaces of the first dielectric layer;
    a conformal insulating layer on the stepped top surface; and
    a MIMcap on the conformal insulating layer;
    wherein the MIMcap conforms to the stepped top surface.

2. The MIMcap as recited in claim 1, further comprising:
    a second dielectric layer on the MIMcap;
    a first via and a second via in the second dielectric layer, the first via electrically connected to a first capacitor plate of the MIMcap, the second via electrically connected to a second capacitor plate;
    wherein the electrical connections to the first and the second vias are provided by physical contact of the respective capacitor plates at a respective via sidewall.

3. The MIMcap as recited in claim 2, wherein the conformal insulating layer is comprised of two conformal dielectric layers.

4. The MIMcap as recited in claim 1, further comprising:
    a second dielectric layer on the MIMcap;
    a third dielectric layer on the second dielectric layer; and
    a second metal line pattern in the second dielectric layer;
    wherein the MIMcap is formed on a first set of layers located vertically between the first and second dielectric layers respectively containing the first and second metal line patterns, wherein the MIMcap is formed at least in part on vertical surfaces of the first set of layers.

5. The MIMcap as recited in claim 2, further comprising a third capacitor plate electrically connected to the first via by physical contact of the third capacitor plate on a vertical surface of a first via sidewall.

6. The MIMcap as recited in claim 5, wherein the first and third capacitor plate of the MIMcap are electrically coupled to a metal line in the first metal line pattern and the second capacitor plate of the MIMcap is electrically coupled to a metal line in the first metal line pattern.

7. The MIMcap as recited in claim 5, wherein the first and third capacitor plate of the MIMcap are electrically coupled to a metal line in the second metal line pattern and the second capacitor plate of the MIMcap is electrically coupled to a metal line in the first metal layer.

8. The MIMcap as recited in claim 5, wherein the first and third capacitor plate of the MIMcap are electrically coupled to a metal line in the first metal pattern and the second capacitor plate of the MIMcap is electrically coupled to a metal line in the second metal pattern.

9. A metal insulator metal capacitor (MIMcap) comprising:
    a first level metal line pattern embedded in a first dielectric layer over a substrate, wherein a set of top surfaces of the first dielectric layer is higher than a set of top surfaces of the first level metal line pattern forming a stepped top surface and a set of bottom surfaces of the first level metal line pattern is lower than the top surfaces of the first dielectric layer;
    a conformal insulating layer on the stepped top surface; and
    a MIMcap on the conformal insulating layer;
    wherein the MIMcap conforms to the stepped top surface.

10. The MIMcap as recited in claim 9, further comprising:
    a second dielectric layer on the MIMcap;
    a first via and a second via in the second dielectric layer, the first via electrically connected to a first capacitor plate of the MIMcap, the second via electrically connected to a second capacitor plate;
    wherein the electrical connections to the first and the second vias are provided by physical contact of the respective capacitor plates at a respective via sidewall.

11. The MIMcap as recited in claim 9, further comprising:
    a second dielectric layer on the MIMcap;
    a third dielectric layer on the second dielectric layer; and
    a second metal line pattern in the second dielectric layer;
    wherein the MIMcap is formed on layers vertically between the layers containing the first and second metal line patterns.

12. The MIMcap as recited in claim 10, further comprising a third capacitor plate electrically connected to the first via by physical contact of the third capacitor plate on a vertical surface of a first via sidewall.

13. A metal insulator metal capacitor (MIMcap) comprising:
    a first level metal pattern in a first dielectric layer over a substrate, the first level metal line pattern and the first dielectric layer having respective sets of top and bottom surfaces, the set of top surfaces of the first level metal line pattern are lower than the set of top surfaces of the first dielectric layer, the top surfaces forming a stepped top surface and the set of bottom surfaces of the first level metal line pattern are lower than the top surfaces of the first dielectric layer; and
    a MIMcap over and conformal to the stepped top surface.

14. The MIMcap as recited in claim 13, further comprising:
    a second dielectric layer on the MIMcap;
    a first via and a second via in the second dielectric layer, the first via electrically connected to a first capacitor plate of the MIMcap, the second via electrically connected to a second capacitor plate;
    wherein the electrical connections to the first and the second vias are provided by physical contact of the respective capacitor plates at a respective via sidewall.

15. The MIMcap as recited in claim 14, further comprising:
    a second dielectric layer on the MIMcap in which a second metal line pattern is formed, wherein the first capacitor plate of the MIMcap is electrically coupled to a metal line in the first metal line pattern and the second capacitor plate of the MIMcap is electrically coupled to a metal line in the second metal line pattern.

16. The MIMcap as recited in claim 15, further comprising a third capacitor plate, wherein the first and third capacitor plates of the MIMcap are electrically coupled to a metal line in the first metal line pattern by physical contact of the first and third capacitor plates to a sidewall of the first via.

17. The MIMcap as recited in claim 14, further comprising:
    a second dielectric layer on the MIMcap in which a second metal line pattern is formed, wherein the first capacitor plate of the MIMcap is only electrically coupled to a metal line in the first metal line pattern and the second capacitor plate of the MIMcap is only electrically coupled to a metal line in the second metal line pattern.

* * * * *